(12) United States Patent
Kohno

(10) Patent No.: US 10,014,153 B2
(45) Date of Patent: Jul. 3, 2018

(54) ELECTRON MICROSCOPE AND METHOD OF ABERRATION MEASUREMENT

(71) Applicant: JEOL Ltd., Tokyo (JP)

(72) Inventor: Yuji Kohno, Tokyo (JP)

(73) Assignee: JEOL Ltd. (JP)

( * ) Notice: Subject to any disclaimer, the term of this patent is extended or adjusted under 35 U.S.C. 154(b) by 0 days.

(21) Appl. No.: 15/422,936

(22) Filed: Feb. 2, 2017

(65) Prior Publication Data
US 2017/0236684 A1  Aug. 17, 2017

(30) Foreign Application Priority Data

Feb. 3, 2016  (JP) .................................. 2016-18790

(51) Int. Cl.
| | | |
|---|---|---|
| *H01J 37/153* | (2006.01) | |
| *H01J 37/22* | (2006.01) | |
| *H01J 37/28* | (2006.01) | |
| *H01J 37/244* | (2006.01) | |
| *H01J 37/26* | (2006.01) | |

(52) U.S. Cl.
CPC ............ *H01J 37/153* (2013.01); *H01J 37/22* (2013.01); *H01J 37/222* (2013.01); *H01J 37/244* (2013.01); *H01J 37/265* (2013.01); *H01J 37/28* (2013.01); *H01J 2237/0453* (2013.01); *H01J 2237/1534* (2013.01); *H01J 2237/24455* (2013.01); *H01J 2237/2802* (2013.01)

(58) Field of Classification Search
CPC ............... H01J 37/153; H01J 2237/153; H01J 2237/1532; H01J 2237/1534; H01J 2237/1536; H01J 2237/2802
See application file for complete search history.

(56) References Cited

U.S. PATENT DOCUMENTS

| | | | | |
|---|---|---|---|---|
| 2002/0130262 A1* | 9/2002 | Nakasuji | ............... | G01N 23/225 250/311 |
| 2004/0119022 A1* | 6/2004 | Sato | ...................... | H01J 37/153 250/396 R |
| 2012/0235035 A1* | 9/2012 | Nagaoki | ................. | H01J 37/09 250/307 |
| 2013/0126729 A1* | 5/2013 | Own | .................... | C12Q 1/6869 250/307 |
| 2014/0138542 A1* | 5/2014 | Inada | ...................... | H01J 37/21 250/310 |

FOREIGN PATENT DOCUMENTS

JP          201222971 A    2/2012

* cited by examiner

*Primary Examiner* — Jason McCormack
*Assistant Examiner* — Sean Luck
(74) *Attorney, Agent, or Firm* — The Webb Law Firm

(57) ABSTRACT

There is provided an electron microscope capable of measuring aberration with high accuracy. The electron microscope (100) comprises: an electron beam source (10) for producing an electron beam (EB); an illumination lens system (101) for focusing the electron beam (EB) onto a sample (S); a scanner (12) for scanning the focused electron beam (EB) over the sample (S); an aperture stop (30) having a plurality of detection angle-limiting holes (32) for extracting rays of the electron beam (EB) having mutually different detection angles from the electron beam (EB) transmitted through the sample (S); and a detector (20) for detecting the rays of the electron beam (EB) passed through the aperture stop (30).

9 Claims, 17 Drawing Sheets

ELECTRON MICROSCOPE AND METHOD OF ABERRATION MEASUREMENT

BACKGROUND OF THE INVENTION

Field of the Invention

The present invention relates to an electron microscope and method of aberration measurement.

Description of Related Art

A scanning transmission electron microscope (STEM) is an instrument for scanning a focused electron beam over a sample, generating a detection signal from electrons transmitted through the sample or from scattering electrons, and mapping the intensity of the detection signal in synchronism with the scanning of the electron beam, thus obtaining a STEM image. In recent years, scanning transmission electron microscopes have attracted attention as electron microscopes capable of providing quite high spatial resolutions at the atomic level. Since the spatial resolution of a scanning transmission electron microscope depends on the diameter of an electron beam impinging on a sample, it is important to reduce the aberration in enhancing the resolution.

In order to obtain high resolution in a short time during observation, it is necessary to previously grasp aberrations induced at that time. For example, JP-A-2012-22971 discloses a method of aberration measurement for use in a scanning transmission electron microscope equipped with a segmented detector. In this known method of aberration measurement, bright-field and dark-field images are derived simultaneously from plural detector segments of the detector located at different positions. Then, aberration coefficients are computed using these bright-field and dark-field images obtained simultaneously. In this method of JP-A-2012-22971, a dark-field image suffering from a less deviation is used as a positional reference and, therefore, the accuracy at which the aberration coefficients are computed can be improved.

In the method of aberration measurement disclosed in the afore-cited JP-A-2012-22971, a segmented detector must be used as noted above. One example of the method capable of measuring aberrations without using a special detector such as a segmented detector is given below.

FIGS. 25 and 26 illustrate one example of the method of aberration measurement for use in a scanning transmission electron microscope. As shown in FIG. 25, in a scanning transmission electron microscope, an electron beam EB is focused onto a sample S by an illumination lens system (not shown). The electron beam EB transmitted through the sample S is detected by a detector 2. A deflector 4 is incorporated in an imaging system. In this scanning transmission electron microscope, as shown in FIG. 26, the detection angle can be controlled by deflecting the electron beam EB by means of the deflector 4.

FIG. 27 is a schematic representation showing a bright-field STEM image $I_1$ obtained under conditions where the electron beam EB is not deflected by the deflector 4. On the other hand, FIG. 28 is a schematic representation showing a bright-field STEM image $I_2$ obtained under conditions where the electron beam EB is deflected by the deflector 4.

As shown in FIG. 25, if a geometric aberration (defocus in the case of FIG. 25) is present in the illumination lens system, the position of impingement of the electron beam EB on the sample S is different for each different angle of convergence and thus the beam does not converge into one point. If the electron beam EB is deflected by the deflector 4, the detector 2 detects rays of the electron beam EB having an angle of incidence (relative to the sample S) corresponding to the amount of deflection. If the angle of incidence relative to the sample S varies, the position of impingement of the beam EB on the sample S deviates according to the amount of aberration in the illumination lens system. Therefore, there occurs shifting of the bright-field STEM image $I_1$ and bright-field STEM image $I_2$ which are formed of the rays of the electron beam EB having mutually different angles of incidence to the sample S as shown in FIGS. 27 and 28. The amount of positional deviation between these bright-field STEM images $I_1$ and $I_2$ corresponds to the aberration in the illumination lens system.

The aberration in the illumination lens system can be calculated from the amount of positional deviation between plural bright-field STEM images obtained by repeating the acquisition of a bright-field STEM image while varying the amount of deflection of the electron beam EB by the deflector 4.

The above-described method of aberration measurement needs acquisition of a number of bright-field STEM images. Furthermore, image drifts occurring during acquisition of the bright-field STEM images are added to the amount of positional deviation between the bright-field STEM images as well as geometric aberration. It takes a long time to acquire such a number of bright-field STEM images and so the above-described method of aberration measurement is greatly affected by image drifts. This makes it difficult to measure aberrations with high accuracy.

SUMMARY OF THE INVENTION

In view of the foregoing problem, the present invention has been made. One object associated with some aspects of the present invention is to provide an electron microscope and method of aberration measurement capable of measuring aberrations with high accuracy.

(1) An electron microscope associated with the present invention comprises: an electron beam source for producing an electron beam; an illumination lens system for focusing the electron beam onto a sample; a scanner for scanning the focused electron beam over the sample; an aperture stop having a plurality of detection angle-limiting holes for extracting rays of the electron beam having mutually different detection angles from the electron beam transmitted through the sample; and a detector for detecting the rays of the electron beam passed through the aperture stop.

Since such an electron microscope has the aperture stop provided with the plural detection angle-limiting holes for extracting rays of the electron beam having mutually different detection angles from the electron beam transmitted through the sample, plural images formed from the electron beam rays having the mutually different detection angles can be obtained at the same time. Consequently, the effects of image drifts can be reduced, and aberration can be measured with high accuracy.

(2) In one feature of this electron microscope of (1) above, there may be further included: an image generator for generating a first STEM image based on results of detections performed by the detector by extracting the rays of the electron beam having the mutually different detection angles from the electron beam transmitted through the sample; and an aberration calculator for finding an aberration in the illumination lens system based on the first STEM image.

In this electron microscope, the aberration calculator can find an aberration in the illumination lens system on the basis of the first STEM image. The first STEM image generated by the image generator is equivalent to an image obtained by superimposing a plurality of images that are formed from electron beam rays having the mutually different detection angles. Therefore, in this electron microscope, the effects of image drifts can be reduced. The aberration can be measured with high accuracy.

(3) In one feature of the electron microscope of (2) above, the aberration calculator may find the aberration in the illumination lens system based both on the first STEM image and on a second STEM image obtained by extracting rays of the electron beam having a reference detection angle from the electron beam transmitted through the sample.

In this electron microscope, the aberration in the illumination lens system is found based on the first and second STEM images and so the effects of image drifts can be reduced. Also, the aberration can be measured with high accuracy.

(4) In one feature of the electron microscope of (3) above, the aberration calculator may find the aberration in the illumination lens system by calculating a correlation function between the first and second STEM images.

In this electron microscope, the aberration in the illumination lens system is found by calculating a correlation function between the first and second STEM images and so the effects of image drifts can be reduced. The aberration can be measured with high accuracy.

(5) In one feature of the electron microscope of any one of (1)-(4) above, the detector may have an annular first detector segment and a second detector segment formed in an area surrounded by the first detector segment. The first and second detector segments can independently detect rays of the electron beam. The aperture stop may have a reference hole for extracting rays of the electron beam having a reference detection angle from the electron beam transmitted through the sample. In the first detector segment, rays of the electron beam passed through the plural detection angle-limiting holes may be detected. In the second detector segment, the rays of the electron beam passed through the reference hole may be detected.

In this electron microscope, the first and second STEM images can be obtained simultaneously. Accordingly, in this electron microscope, the effects of image drifts between the first and second STEM images can be reduced. The aberration can be measured with high accuracy.

(6) In one feature of the electron microscope of (5) above, the first detector segment may be split into a plurality of subsegments that can independently detect rays of the electron beam.

In this electron microscope, the number of the first STEM images that can be obtained at the same time can be increased.

(7) In one feature of the electron microscope of any one of (1)-(4) above, the aperture stop may have a first aperture element and a second aperture element. The first aperture element has the aforementioned plurality of detection angle-limiting holes. The second aperture element has a reference hole for extracting rays of the electron beam having a reference detection angle from the electron beam transmitted through the sample.

In this electron microscope, the aberration can be measured with high accuracy.

(8) A method of aberration measurement associated with the present invention is for use in an electron microscope having an electron beam source for producing an electron beam, an illumination lens system for focusing the electron beam onto a sample, a scanner for scanning the focused electron beam over the sample, and an aperture stop having a plurality of detection angle-limiting holes for extracting rays of the electron beam having mutually different detection angles from the electron beam transmitted through the sample, the method being adapted to measure an aberration in the illumination lens system. The method starts with detecting the rays of the electron beam transmitted through the aperture stop. Then, STEM images are obtained. The aberration in the illumination lens system is found based on the STEM images.

This method of aberration measurement involves the steps of: detecting rays of the electron beam passed through the aperture stop having the detection angle-limiting holes for extracting rays of the electron beam having the mutually different detection angles from the electron beam transmitted through the sample; and obtaining STEM images. Therefore, plural images formed from electron beam rays having mutually different detection angles can be obtained at the same time. Consequently, the effects of image drifts can be reduced, and the aberrations can be measured with high accuracy.

DESCRIPTION OF THE INVENTION

The preferred embodiments of the present invention are hereinafter described in detail with reference to the drawings. It is to be understood that the embodiments described below are not intended to unduly restrict the content of the present invention delineated by the appended claims and that not all the configurations described below are essential constituent components of the invention.

1. First Embodiment
1.1. Electron Microscope

Figure 1:
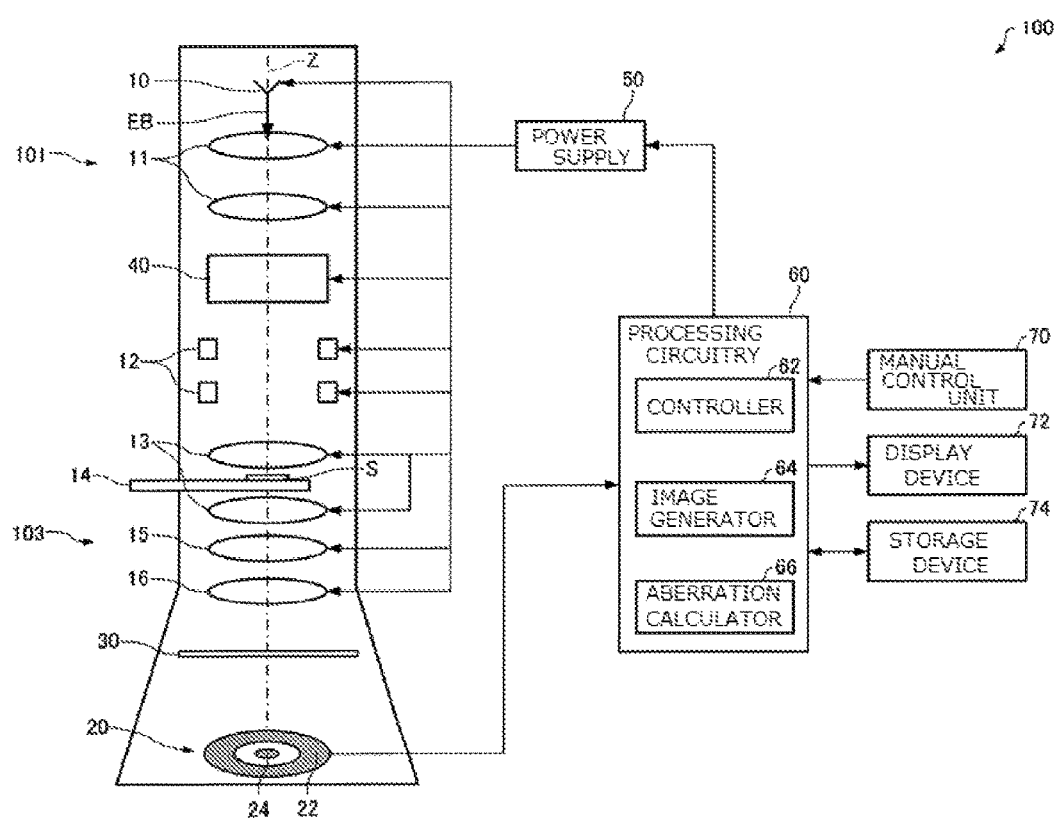
FIG. 1 is a schematic representation, partly in block form, of an electron microscope associated with a first embodiment of the present invention.

An electron microscope associated with a first embodiment of the present invention is first described by referring to FIG. 1, which schematically shows the configuration of the electron microscope, 100.

The electron microscope 100 is a scanning transmission electron microscope. The microscope 100 can obtain scanning transmission electron microscope (STEM) images by scanning a focused electron beam EB over a sample S and mapping the intensity of a detection signal arising either from transmitted electrons from the sample S or from scattering electrons in synchronism with the scanning of the electron beam EB.

As shown in FIG. 1, the electron microscope 100 includes an electron beam source 10, condenser lenses 11, deflectors 12 (which together constitute one example of scanner), an objective lens system 13, a sample stage 14, an intermediate lens 15, a projector lens 16, a detector 20, an aperture stop 30 (one example of aperture stop) used for aberration measurement, an aberration corrector 40, a power supply 50, processing circuitry 60, a manual control unit 70, a display device 72, and a storage device 74.

The electron beam source 10 emits the electron beam EB. For example, the electron beam source 10 is an electron gun that accelerates electrons emitted from a cathode by means of an anode such that the accelerated electrons are emitted as the electron beam EB.

The condenser lenses 11 converge the electron beam EB emitted from the electron beam source 10. The condenser lenses 11 and objective lens system 13 (more correctly, a magnetic field in front of the objective lens system 13) together constitute an illumination lens system 101 that focuses the electron beam EB onto the sample S.

The deflectors 12 deflect the electron beam EB. The deflectors 12 can scan the converged electron beam EB over the sample S by supplying a scan signal from the power supply 50 to the deflectors 12.

The objective lens system 13 focuses the electron beam EB onto the sample S and is used to image electrons transmitted through the sample S.

The sample stage 14 holds the sample S. Also, the sample stage 14 can move the sample S horizontally and vertically. Furthermore, the sample stage 14 can tilt the sample S.

The intermediate lens 15 focuses the back focal plane (diffraction plane) of the objective lens system 13 onto the object plane of the projector lens 16. The projector lens 16 focuses the image plane of the intermediate lens 15 onto the detection surface of the detector 20. The camera length can be adjusted by varying the excitations of the intermediate lens 15 and projector lens 16.

The objective lens system 13 (more correctly, a magnetic field behind the objective lens system 13), the intermediate lens 15, and projector lens 16 together constitute an imaging lens system 103 of the electron microscope 100.

The detector 20 detects the electron beam EB transmitted through the sample S. The detector 20 has a first detector segment 22 and a second detector segment 24.

The first detector segment 22 is annular in form and formed around the second detector segment 24.

The second detector segment 24 is formed in an area surrounded by the first detector segment 22 and is circular in form. The second detector segment 24 is so positioned that its center lies, for example, on the optical axis Z.

The first detector segment 22 and second detector segment 24 can independently detect rays of the electron beam EB. Therefore, in the electron microscope 100, with one scan of the electron beam EB, STEM images can be obtained based on the results of detections respectively made by the first detector segment 22 and second detector segment 24.

The first detector segment 22 and the second detector segment 24 are separate detectors, for example. The detector 20 provides a detection signal responsive to rays of the electron beam EB detected by the first detector segment 22 and a detection signal responsive to rays of the electron beam EB detected by the second detector segment 24 to the processing circuitry 60.

The aperture stop 30 for aberration measurement is incorporated in the imaging lens system 103. In the illustrated example, the aperture stop 30 is disposed between the projector lens 16 and the detector 20. No restriction is placed on the position of the aperture stop 30 as long as it is incorporated in the imaging lens system 103.

The aperture stop 30 for aberration measurement is configured to be movable between a position on the optical axis Z and a position off the optical axis Z. In the electron microscope 100, when STEM images are taken for aberration measurement, the aperture stop 30 is located on the optical axis Z. When STEM images are taken to observe the sample S, the aperture stop 30 is located off the optical axis Z.

Figure 2:
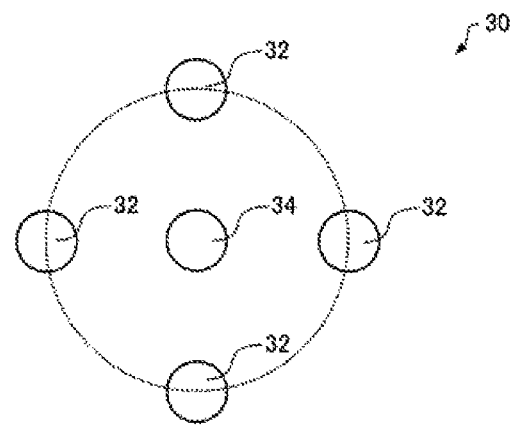
FIG. 2 is a schematic view of an aberration measurement aperture stop as viewed from a direction along the optical axis.

FIG. 2 is a schematic view of the aperture stop 30 for aberration measurement, as viewed from a direction along the optical axis Z. As shown in FIG. 2, the aperture stop 30 for aberration measurement has a plurality of detection angle-limiting holes 32 and a reference hole 34. In the illustrated example, there are four detection angle-limiting holes 32 but no restriction is imposed on the number of the holes 32. The detection angle-limiting holes 32 are arranged around the reference hole 34 and, for example, positioned equidistantly from the reference hole 34. The plural detection angle-limiting holes 32 are arranged on a virtual circle whose center lies at the reference hole 34. The plural detection angle-limiting holes 32 make it possible to extract rays of the electron beam EB having mutually different detection angles from the electron beam EB transmitted through the sample S.

No restrictions are imposed on the number or arrangement of the detection angle-limiting holes 32. They may be appropriately modified according to aberrations to be measured.

There is only one aberration measurement aperture stop 30 in the reference hole 34. The reference hole 34 is located on the optical axis Z. Note that the reference hole 34 does not always need be located on the optical axis Z.

The reference hole 34 and detection angle-limiting holes 32 are all identically shaped. In the illustrated example, they are shaped in a circle. As an example, the reference hole 34 and detection angle-limiting holes 32 are identical in diameter.

As the diameter of the reference hole 34 and the diameter of the detection angle-limiting holes 32 decrease, the angular resolution is improved but the amount of detected signal decreases and thus the S/N will deteriorate. For this reason, the diameter of the reference hole 34 and the diameter of the detection angle-limiting holes 32 may be set appropriately according to the required resolution and S/N.

Figure 3:
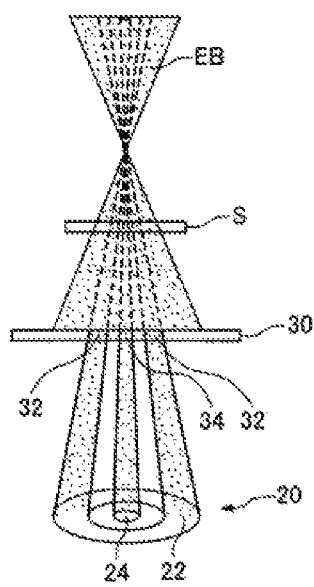
FIG. 3 is an electron ray diagram illustrating the functions of the aberration measurement aperture stop.
Figure 4:
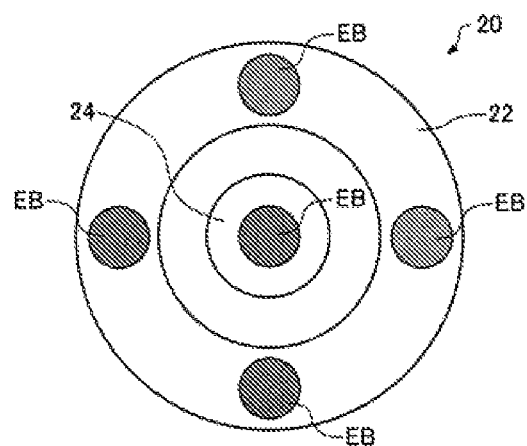
FIG. 4 is a schematic view illustrating the manner in which an electron beam impinges on a detector.

FIG. 3 illustrates the functions of the aperture stop 30 for aberration measurement. FIG. 4 schematically illustrates the manner in which the electron beam EB impinges on the detector 20.

As shown in FIGS. 3 and 4, the rays of the electron beam EB that have passed through the detection angle-limiting holes 32 hit the first detector segment 22. That is, the rays of the electron beam EB which have been extracted by the detection angle-limiting holes 32 and which have mutually different detection angles are detected by the first detector segment 22.

The rays of the electron beam EB passed through the reference hole 34 impinge on the second detector segment 24. That is, the rays of the electron beam EB which have a reference detection angle and which have been extracted through the reference hole 34 are detected by the second detector segment 24.

Figure 5:
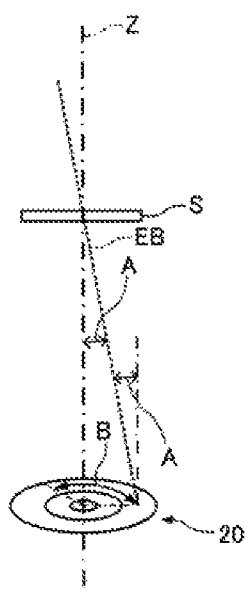
FIG. 5 is an electron ray diagram illustrating the detection angle for the electron beam.

FIG. 5 illustrates the angle at which the electron beam EB is detected, it being noted that the angle may be herein referred to also as the detection angle. The detection angle of the electron beam EB is obtained when the beam EB is detected by the detector 20. The detection angle of the electron beam EB is represented in terms of incidence angle A and azimuthal angle B as shown in FIG. 5.

The incidence angle A is defined as the angle of the electron beam EB incident on the detection surface of the detector 20 relative to the detection surface. The azimuthal angle B is the angle of the electron beam EB incident on the detection surface of the detector 20, taken about the optical axis Z.

The rays of the electron beam EB passing through the detection angle-limiting holes 32 have incidence angles A which are equal to each other but different in azimuthal angle B. That is, the rays of the electron beam EB which have passed through the angle-limiting holes 32 impinge on the first detector segment 22 at the incidence angles A which are equal to each other and at their respective different azimuthal angles B.

The rays of the electron beam EB which have passed through the reference hole 34 have a detection angle equal to incidence angle A=0°. That is, the rays of the electron beam EB passed through the reference hole 34 impinge on the second detector segment 24 at incidence angle A=0°.

As shown in FIG. 1, the aberration corrector 40 is incorporated in the illumination lens system 101 of the electron microscope 100. The aberration corrector 40 is configured including multipole elements such as quadrupole or hexapole elements. The aberration corrector 40 can correct the aberration in the illumination lens system 101 by producing given magnetic fields using the multipole elements.

The power supply 50 applies voltages or currents to the electron beam source 10 and to the electron optics 11, 12, 13, 15, 16, and 40 based on control signals from a controller 62.

The manual control unit 70 performs processing to obtain a control signal responsive to a user's manipulation and to send the signal to the processing circuitry 60. For example, the manual control unit 70 is made of buttons, keys, a touch panel display, a microphone, or the like.

The display device 72 is used to display images generated by the processing circuitry 60. The function of the display device 72 can be implemented by an LCD, a CRT, or the like.

The storage device 74 stores programs, data, and related information permitting the processing circuitry 60 to perform various kinds of calculational operations and control operations. Furthermore, the storage device 74 is used as a working area for the processing circuitry 60 to temporarily store the results of calculations and the like executed by the processing circuitry 60 in accordance with various programs. The function of the storage device 74 can be implemented by a hard disk, a RAM, or the like.

The processing circuitry 60 operates to control various portions of the electron microscope 100, to generate STEM images based on the results of detections done by the detector 20, and to calculate aberrations. The functions of the processing circuitry 60 can be implemented by causing a processor (such as a CPU, a DSP, or the like) to execute programs. At least some of the functions of the processing circuitry 60 may be realized by dedicated circuitry such as an ASIC (e.g., a gate array). The processing circuitry 60 includes the controller 62, an image generator 64, and an aberration calculator 66.

The controller 62 provides control of various constituent components of the electron microscope 100 based on control signals from the manual control unit 70. The controller 62 may control the electron optics 11, 12, 13, 15, 16, and 40 based on settings of these electron optics 11, 12, 13, 15, 16, and 40, the settings being previously stored in the storage device 74.

The image generator 64 generates STEM images based on the output signal from the detector 20. The image generator 64 generates bright-field STEM images based on a detection signal responsive to the rays of the electron beam EB which are detected by the first detector segment 22 of the detector 20. Furthermore, the image generator 64 generates bright-field STEM images based on a detection signal responsive to the rays of the electron beam EB detected by the second detector segment 24 of the detector 20. The image generator 64 creates STEM images while bringing the detection signal responsive to rays of the electron beam EB into synchronism with a scan signal for the electron beam EB.

The aberration calculator 66 calculates the aberration in the illumination lens system 101. The processing performed by the aberration calculator 66 will be described later.

1.2. Method of Aberration Measurement (1) Principle of Aberration Measurement

Figure 6:
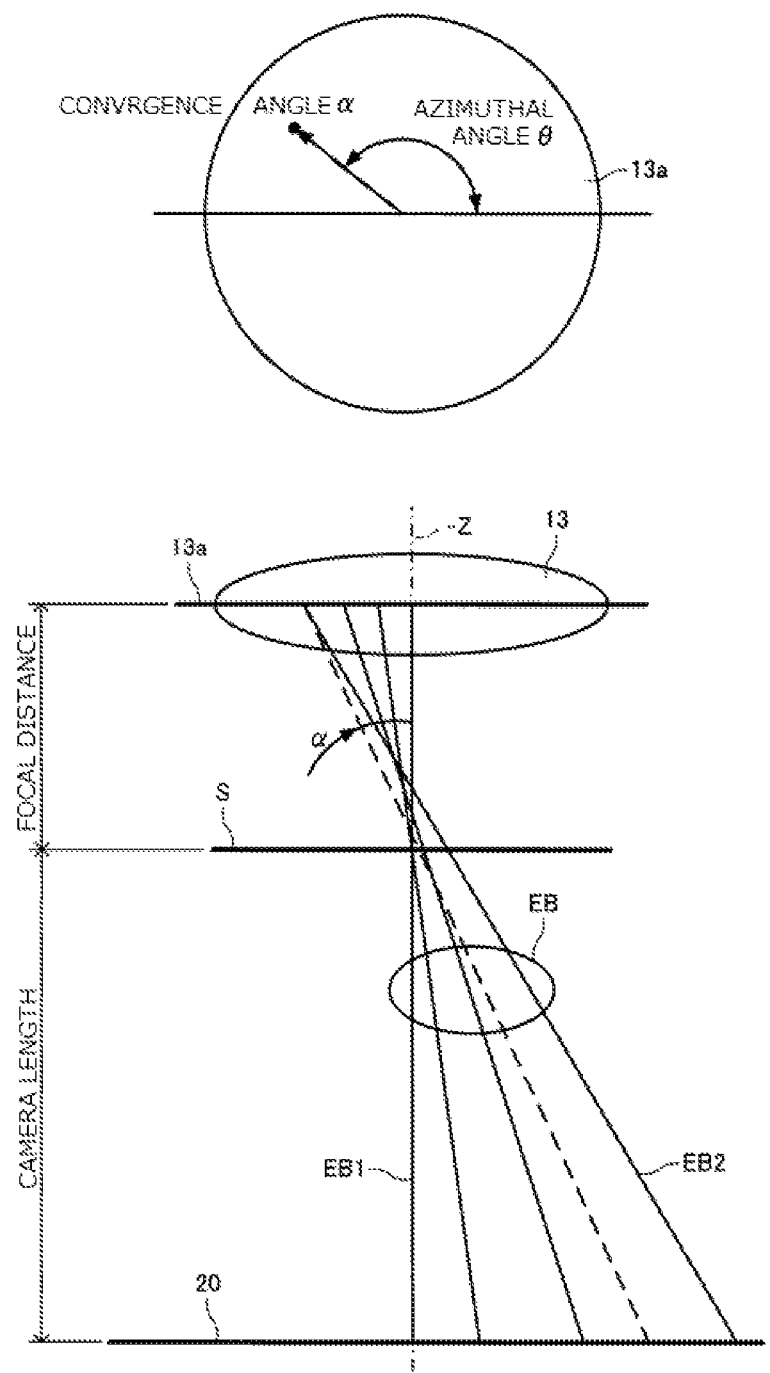
FIG. 6 is a schematic diagram of one example of an electron beam orbit from a vicinity of a sample to the detector, assumed when a bright-field STEM image is obtained.

The principle on which aberrations in the electron microscope 100 are measured is first described. FIG. 6 schematically illustrates one example of orbit of the electron beam EB from a vicinity of the sample S to the detector 20, assumed when a bright-field STEM image is obtained.

The sample S is placed in a position that is spaced at a distance equal to the focal distance from the front focal plane 13a of the objective lens system 13. The detector 20 is located in a position that is spaced at a distance equal to the camera length from the sample S. FIG. 6 illustrates the manner in which the electron beam EB passes through the front focal plane 13a of the objective lens system 13 and is converged toward the sample S by the focusing action of the objective lens system 13.

The convergence angle $\alpha$ is the convergence angle of the electron beam EB on the sample S (i.e., the incidence angle of the electron beam EB to the sample S). The azimuthal angle $\theta$ is the azimuthal angle of the electron beam EB on the sample S. Where there is no aberration, rays of the electron beam converge into one point on the sample S irrespective of the convergence angle $\alpha$ or azimuthal angle $\theta$ of the beam. On the other hand, where there is aberration (geometric aberration), as the convergence angle $\alpha$ of the electron beam EB on the sample S increases, the beam intersects the optical axis Z at a point lying more forwardly of the sample S. The position of beam impingement gets further away from the assumed position of beam impingement with increasing the convergence angle $\alpha$ of the electron beam EB. If this aberration is due to spherical aberration in the objective lens system 13, the deviation of the position of beam impingement is in proportion to the cube of the convergence angle $\alpha$ as is well known in the art.

Figure 7:
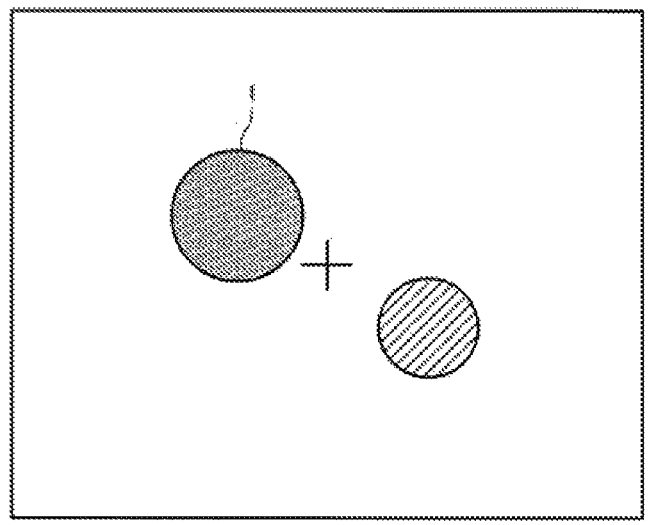
FIG. 7 is a schematic representation of a bright-field STEM image formed by electron beam rays that have passed on the optical axis.
Figure 8:
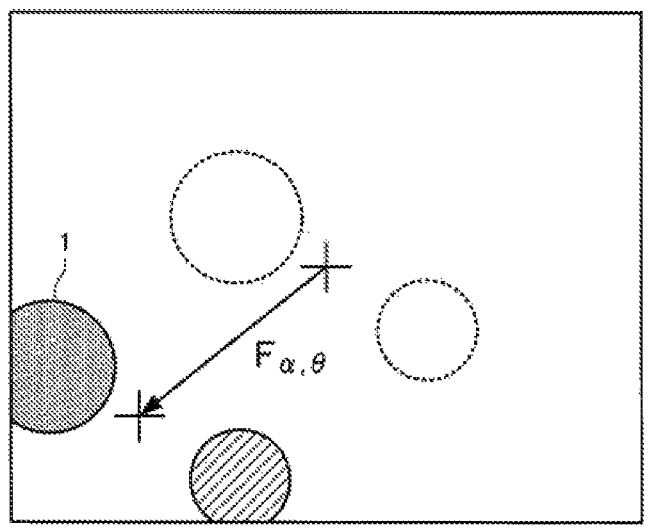
FIG. 8 is a schematic representation of a bright-field STEM image formed by electron beam rays having a convergence angle of $\alpha$.

Under the effects of such aberration, if rays EB1 of the electron beam traveling on the optical axis Z form a bright-field STEM image as shown in FIG. 7, rays EB2 of the electron beam having a convergence angle $\alpha$ ($\alpha \neq 0$) involve a positional deviation from the bright-field STEM image of FIG. 7 as shown in FIG. 8 for the following reason. Because of a shift of the position of beam impingement due to aberration, it is necessary to shift the rays EB2 of the electron beam further in order to form an image of atoms 1 (in other words, to cause the rays to impinge on the atoms 1).

That is, plural bright-field STEM images formed by different rays of the electron beam having mutually different values of the convergence angle $\alpha$ inevitably involve positional deviations from each other due to aberration. That is, if it is assumed that one final image of the sample S is used as a reference and that the amount of positional deviation of such a bright-field STEM image is given by a positional deviation vector $F_{\alpha,\theta}$, then a vector in the reverse direction corresponds to a geometric aberration vector $G_{\alpha,\theta}$, indicative of an aberration appearing in each bright-field STEM image.

The front focal plane 13a (also referred to as the aperture plane) of the objective lens system 13 is an angular spatial plane of the electron beam EB. Specifically, as illustrated conceptually in FIG. 6, if each position of the electron beam EB on the front focal plane 13a is expressed in terms of polar coordinates, its radial component and angular component can be uniquely given by convergence angle $\alpha$ and azimuthal angle $\theta$, respectively. An aberration function $\chi$ in the front focal plane 13a is represented by the sum of wave front aberrations each of which is a function of the convergence angle $\alpha$ and azimuthal angle $\theta$. Where high-resolution imaging at the atomic level is performed, only on-axis aberrations are treated. Accordingly, aberration function $\chi(\alpha, \theta)$ is given by $\chi(\alpha,\theta)$=focal deviation(defocus)+two-fold astigmatism+on-axis coma+three-fold astigmatism+spherical aberration+star aberration++four-fold astigmatism+fourth-order coma+three-lobe aberration+five-fold astigmatism+fifth-order spherical aberration+six-fold astigmatism That is, aberration function $\chi(\alpha, \theta)$ is represented by the following Eq. (1):

$$\chi(\alpha, \theta) = \frac{1}{2}\alpha^2 o_2 + \frac{1}{2}\alpha^2 a_2 \cos(2(\theta - \theta_{a2})) + \qquad (1)$$
$$\frac{1}{2}\alpha^3 p_3 \cos(\theta - \theta_{p3}) + \frac{1}{3}\alpha^3 a_3 \cos(3(\theta - \theta_{a3})) +$$
$$\frac{1}{4}\alpha^4 o_4 + \frac{1}{4}\alpha^4 q_4 \cos(2(\theta - \theta_{q4})) +$$
$$\frac{1}{4}\alpha^4 a_4 \cos(4(\theta - \theta_{a4})) +$$
$$\frac{1}{5}\alpha^5 p_5 \cos(\theta - \theta_{p5}) + \frac{1}{5}\alpha^5 r_5 \cos(3(\theta - \theta_{r5})) +$$
$$\frac{1}{5}\alpha^5 a_5 \cos(5(\theta - \theta_{a5})) +$$
$$\frac{1}{6}\alpha^6 o_6 + \frac{1}{6}\alpha^6 a_6 \cos(6(\theta - \theta_{a6})) + \dots$$

The components $G_\alpha$ and $G_\theta$ of the geometric aberration vector $G_{\alpha,\theta}$ in the directions of convergence angle and azimuthal angle, respectively, are obtained by taking partial derivatives of the aberration function $\chi$ with respect to the convergence angle $\alpha$ and azimuthal angle $\theta$.

$$G_{\alpha,\theta} = (G_\alpha, G_\theta) = \left(\frac{\lambda}{2\pi}\frac{\partial \chi}{\partial \alpha}, \frac{\lambda}{2\pi}\frac{1}{\alpha}\frac{\partial \chi}{\partial \theta}\right) \qquad (2)$$

In particular, by obtaining a bright-field STEM image for each of plural sets of values of the convergence angle $\alpha$ and azimuthal angle $\theta$, as many geometric aberration vectors $G_{\alpha,\theta}$ are derived as the number of the sets. Aberration coefficients can be calculated by applying a least squares method or other mathematical process to these geometric aberration vectors.

The convergence angle $\alpha$ of the electron beam EB on the sample S corresponds to the incidence angle A of the rays of the electron beam EB transmitted through the sample S. The azimuthal angle $\theta$ of the electron beam EB on the sample S corresponds to the azimuthal angle B of the rays of the electron beam EB transmitted through the sample S. Therefore, an aberration can be computed from bright-field STEM images (hereinafter referred to as the first bright-field STEM images) which have been obtained by extracting electron beam rays having mutually different detection angles from the rays of the electron beam EB transmitted through the sample S by the use of the aperture stop 30 for aberration measurement. A method of aberration measurement using the first bright-field STEM images is described below.

First, a method of obtaining first bright-field STEM images is described. A first bright-field STEM image can be derived by detecting rays of the electron beam EB passed through the detection angle-limiting holes 32 with the first detector segment 22 of the detector 20, the holes 32 being in the aperture stop 30 for aberration measurement. In the electron microscope 100, the second bright-field STEM images providing a basis for calculating aberrations can be obtained simultaneously with the first bright-field STEM images.

Each second bright-field STEM image is generated by extracting rays of the electron beam EB having a reference detection angle from the rays of the electron beam EB transmitted through the sample S. The second bright-field STEM image can be obtained by detecting the rays of the electron beam EB passed through the reference hole 34 with the second detector segment 24, the reference hole 34 being in the aberration measurement aperture stop 30.

Figure 9:
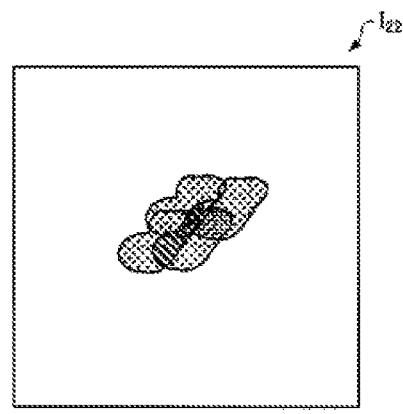
FIG. 9 is a schematic representation of a first bright-field STEM image.
Figure 10:
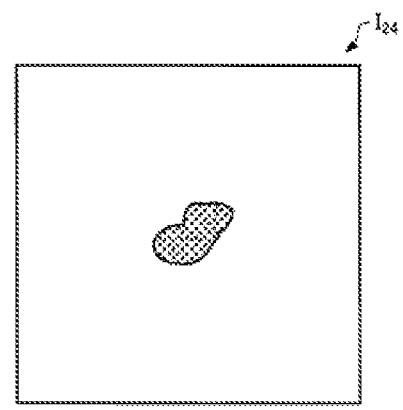
FIG. 10 is a schematic representation of a second bright-field STEM image.

FIG. 9 is a schematic representation of a first bright-field STEM image $I_{22}$. FIG. 10 is a schematic representation of a second bright-field STEM image $I_{24}$.

The first bright-field STEM image $I_{22}$ has been obtained by detecting the rays of the electron beam EB passed through four detection angle-limiting holes 32 spaced from the optical axis Z. Since the rays of the electron beam EB passed through the four holes 32 are different in detection angle, if there is any aberration in the illumination lens system 101, the rays pass through the sample S at different positions. Consequently, the first bright-field STEM image $I_{22}$ is produced by shifting the second bright-field STEM images $I_{24}$ and superimposing them on each other. In this example, the first bright-field STEM image $I_{22}$ has been obtained by detecting the rays of the electron beam EB passed through the four detection angle-limiting holes 32 and, therefore, the first bright-field STEM image $I_{22}$ is a superimposition of four second bright-field STEM images $I_{24}$ which are shifted from each other in different directions.

A method of calculating an aberration using the first STEM image is next described. An aberration in the illumination lens system 101 can be computed based on the first bright-field STEM image $I_{22}$ and the second bright-field STEM image $I_{24}$. The aberration in the illumination lens system 101 can be found by calculating a correlation function between the first bright-field STEM image $I_{22}$ and second bright-field STEM image $I_{24}$.

Figure 11:
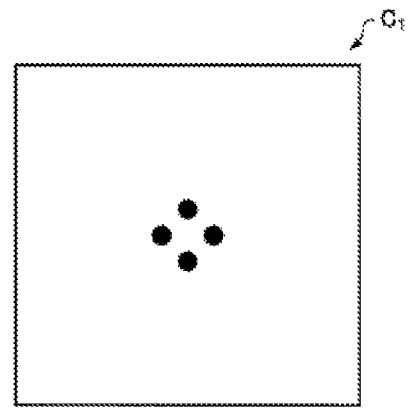
FIG. 11 is a schematic representation of an image indicative of the result of a computation of a correlation function between the first and second bright-field STEM images.

FIG. 11 is a schematic representation illustrating an image $C_1$ indicative of the result of a computation of a correlation function between the first bright-field STEM image $I_{22}$ and second bright-field STEM image $I_{24}$.

A computation of a correlation function between the first bright-field STEM image $I_{22}$ and second bright-field STEM image $I_{24}$ results in four peaks as shown in FIG. 11. These four peaks correspond to the amounts of positional deviations of images formed out of the rays of the electron beam EB having four mutually different detection angles from an image formed out of the rays of the electron beam EB having the reference detection angle. In consequence, aberration coefficients can be calculated by identifying which peaks correspond to what detection angles and finding magnitudes and directions of vectors interconnecting the peaks and the center of the image $C_1$.

Defocus can be employed to identify which peaks correspond to what detection angles. For example, detection angles which respectively correspond to image magnifications and to the detection angle-limiting holes 32 are previously measured. Then, two STEM images are obtained while varying the defocus under conditions where the aperture stop 30 for aberration measurement is placed on the optical axis Z. If a correlation function between these two STEM images with varied degrees of defocus is found, the positions of peaks appearing in the correlation function move in proportion to the added defocus and detection angle. Use of this phenomenon makes it possible to identify which peaks correspond to what detection angles.

If variations of the degree of defocus are employed, other quantities can also be calculated. The deviation between the center of the detection system in the direction of scanning of the electron beam EB and the optical axis Z can be known from the above-described correlation function between the two STEM images with varied degrees of defocus. If relative positions of the detection angle-limiting holes 32 in a reciprocal space are known, then detection angles corresponding to the peaks appearing in the correlation function between the two STEM images having varied degrees of defocus can be known. Therefore, the deviation of the aperture stop 30 for aberration measurement from the optical axis Z can be computed. Hence, the deviation of the aperture stop 30 from the optical axis Z can be corrected, for example, by the deflector (not shown) of the imaging system. In addition, the deviation of the aperture stop 30 from the optical axis Z can be incorporated in a computation of an aberration.

Even where the absolute value of the added amount of defocus is not known, if the image magnification and detection angle are known, the amount of defocus can be found from the aforementioned correlation function between two STEM images with varied degrees of defocus. Furthermore, if the amount of defocus is known, the image magnification and detection angle can be found. Consequently, when the image magnification or direction of scanning is varied, the amount of rotation of the image or image magnification can be calibrated.

Where the aberration is small, peaks appearing in a correlation function may overlap in the center and thus the peaks cannot be separated easily. In this case, a given amount of appropriate aberration is added to separate the peaks. The added aberration is a defocus, for example, because a defocus can be controlled easily and because the peaks are moved uniformly. If a variation in astigmatism or comatic aberration produced concomitantly with a variation of a defocus is previously examined, then aberration remaining when the added defocus is eliminated can be calculated precisely.

Computable aberrations are restricted by the geometry or shape of the aperture stop 30 for aberration measurement. For example, with the aperture stop 30 of FIG. 2, up to the second order aberration can be separated. However, if the amount of spherical aberration is known, lower order aberrations can be calculated while taking account of the effects of the spherical aberration on the assumption that higher order aberrations other than spherical aberration are 0.

Figure 12:
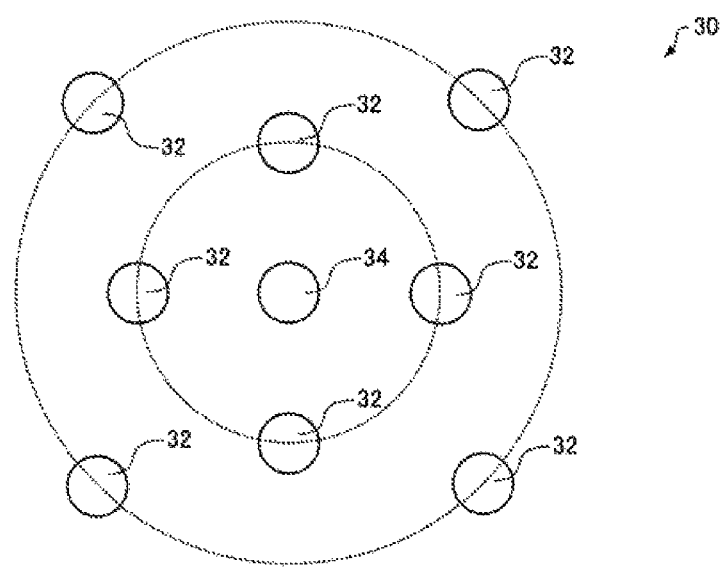
FIG. 12 is a schematic view of a modification of the aberration measurement aperture stop.
Figure 13:
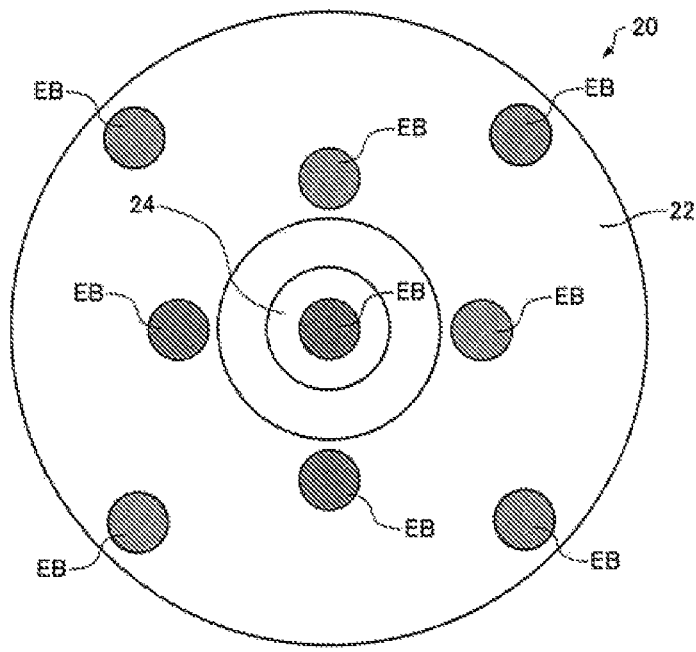
FIG. 13 is a schematic view illustrating the manner in which electron beam rays passed through the aberration measurement aperture stop of FIG. 12 impinge on the detector.

FIG. 12 is a schematic representation illustrating a modification of the aperture stop 30 for aberration measurement. FIG. 13 is a schematic representation illustrating the manner in which the rays of the electron beam EB passed through this aperture stop 30 of FIG. 12 impinge on the detector 20.

In the aperture stop 30 shown in FIG. 12, the detection angle-limiting holes 32 are arranged on two virtual circles disposed coaxially about the center of the reference hole 34. That is, in the example shown in FIG. 12, the plural detection angle-limiting holes 32 are arranged in two layers about the reference hole 34.

In order to increase the number of computable aberrations, the detection angle-limiting holes 32 are arranged in multiple layers as shown in FIG. 12 or the positions of the detection angle-limiting holes 32 are made different for each different layer.

Figure 14:
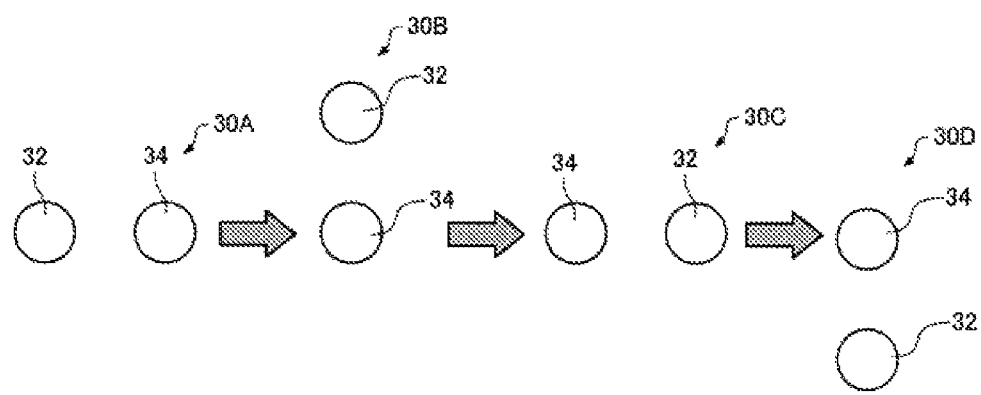
FIG. 14 is a schematic representation of another modification of the aberration measurement aperture stop.

FIG. 14 shows another modification of the aperture stop 30 for aberration measurement. As shown in FIG. 14, plural first bright-field STEM images are obtained using plural aperture stops 30A, 30B, 30C, and 30D for aperture measurement, a correlation function of each of the first bright-field STEM images is calculated, and aberrations can be found. The number of peaks appearing in each one correlation function can be reduced by the use of the plural aperture stops 30A, 30B, 30C, and 30D for aberration measurement. As a consequence, the peaks can be detected easily.

Plural first bright-field STEM images which are different in camera length may be obtained by taking images while varying the camera length by the imaging lens system 103. Furthermore, plural first bright-field STEM images at different angular positions may be derived by taking each image while rotating the image by the imaging lens system 103. In any case, the number of computable aberrations can be increased.

In the electron microscope 100, aberrations can be corrected by operating the aberration corrector 40 based on measured aberrations. If aberrations are corrected, the aperture stop 30 for aberration measurement may deviate from the optical axis Z. Especially, when comatic aberration is corrected, it is highly likely that the aperture stop 30 will deviate from the optical axis Z. In such a case, as described previously, two STEM images having different degrees of defocus are obtained under conditions where the aperture stop 30 for aberration measurement is placed on the optical axis Z, and detection angles are measured using their correlation functions. Consequently, precise aberration measurements and aberration corrections are enabled.

(2) Operation of Electron Microscope

Figure 15:
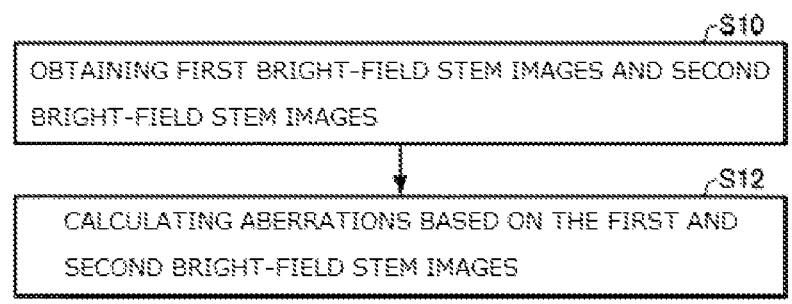
FIG. 15 is a flowchart illustrating one example of method of aberration measurement.

The operation of the electron microscope 100 when measuring aberrations is next described. FIG. 15 is a flowchart illustrating one example of method of aberration measurement for use in the electron microscope 100.

Initially, first bright-field STEM images and second bright-field STEM images are obtained (step S10).

In the electron microscope 100, the electron beam EB is scanned over the sample S while the aperture stop 30 of FIG. 2 for aberration measurement is placed on the optical axis Z. Rays of the electron beam EB transmitted through the sample S and the detection angle-limiting holes 32 are detected by the first detector segment 22. On the other hand, rays of the electron beam EB passed through the reference hole 34 are detected by the second detector segment 24. The image generator 64 generates first bright-field STEM images on the basis of a detection signal responsive to the rays of the electron beam EB detected by the first detector segment 22 of the detector 20. Also, the image generator 64 generates a second bright-field STEM image on the basis of a detection signal responsive to the rays of the electron beam EB detected by the second detector segment 24 of the detector 20. As a result, the first and second bright-field STEM images can be obtained.

Then, the aberration calculator 66 calculates aberrations in the illumination lens system 101 based on the first and second bright-field STEM images (step S12).

The aberration calculator 66 calculates aberrations in the illumination lens system 101 by calculating a correlation function between the first and second bright-field STEM images according to the above-described principle of aberration measurement. Thus, the aberrations in the illumination lens system 101 can be measured.

After the aberration calculator 66 has found the aberrations, the controller 62 may operate the aberration corrector 40 based on the results of calculations of the aberrations performed by the aberration calculator 66 so as to reduce the aberrations in the illumination lens system 101.

The electron microscope 100 has the following features. The electron microscope 100 includes the aberration measurement aperture stop 30 having the plural detection angle-limiting holes 32 for extracting rays of the electron beam EB having mutually different detection angles from the electron beam EB transmitted through the sample S. Therefore, in the electron microscope 100, it is possible to simultaneously obtain plural images formed from the rays of the electron beam EB having mutually different detection angles (convergence angles). In consequence, the effects of image drifts can be reduced, and the aberrations can be measured with high accuracy. Furthermore, in the electron microscope 100, the time taken to obtain images for aberration measurement can be shortened.

The electron microscope 100 includes the image generator 64 for generating a first bright-field STEM image based on the results of detections performed by the detector 20 by extracting rays of the electron beam EB having mutually different detection angles from the electron beam EB transmitted through the sample S and the aberration calculator 66 for finding aberrations in the illumination lens system 101 based on the first bright-field STEM image. The first bright-field STEM image is equivalent to a superimposition of a plurality of images formed from the rays of the electron beam having the mutually different detection angles. Therefore, in the electron microscope 100, the effects of image drifts can be reduced. The aberration can be measured with high accuracy.

In the electron microscope 100, the aberration calculator 66 finds the aberration in the illumination lens system 101 on the basis of the first and second bright-field STEM images. More specifically, the aberration calculator 66 calculates the aberration in the illumination lens system 101 by computing a correlation function between the first and second bright-field STEM images. In this way, in the electron microscope 100, the aberration in the illumination lens system 101 is found based on the first and second bright-field STEM images and so the effects of image drifts can be reduced. The aberration can be measured with high accuracy.

In the electron microscope 100, the detector 20 has the annular first detector segment 22 and the second detector segment 24 formed in an area surrounded by the first detector segment 22. The first detector segment 22 and the second detector segment 24 can independently detect rays of the electron beam EB. The first detector segment 22 detects the rays of the electron beam EB passed through the plural detection angle-limiting holes 32. The second detector segment 24 detects the rays of the electron beam EB passed through the reference hole 34. Therefore, the electron microscope 100 can obtain the first and second STEM images at the same time, i.e., in one measurement. Accordingly, in the electron microscope 100, the effects of image drifts between the first and second bright-field STEM images can be reduced. The aberration can be measured with high accuracy.

2. Second Embodiment

Figure 16:
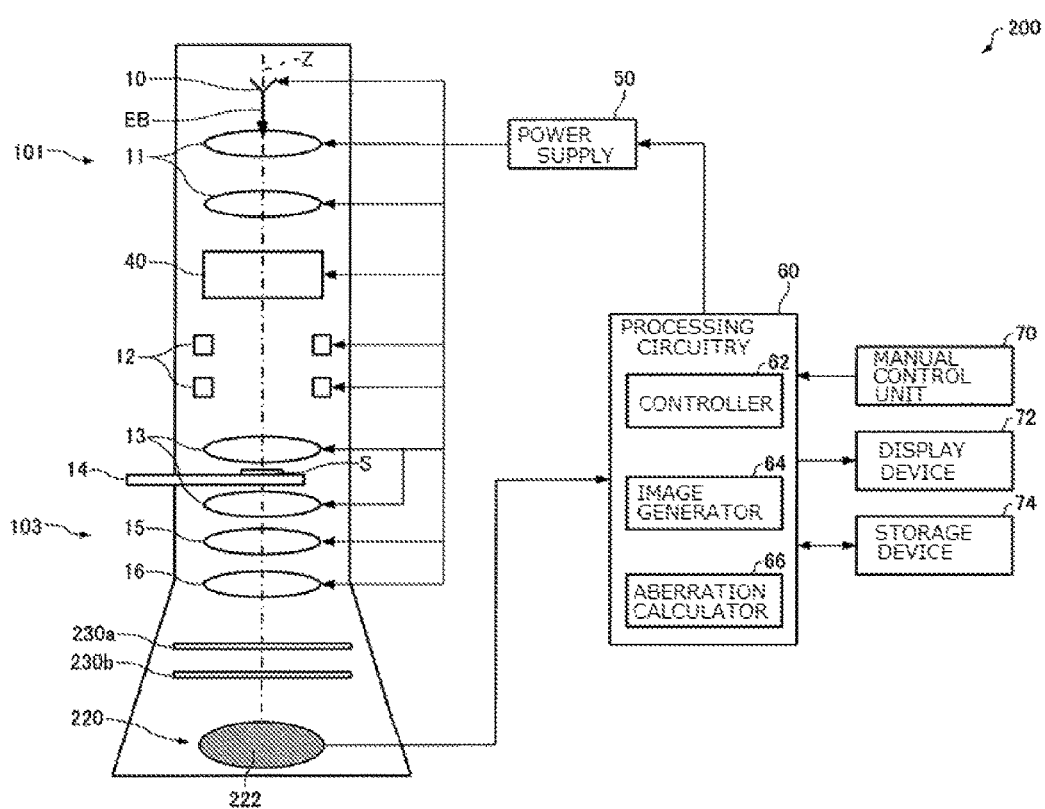
FIG. 16 is a schematic representation, partly in block form, of an electron microscope associated with a second embodiment.

An electron microscope associated with a second embodiment is next described by referring to FIG. 16, which schematically shows the electron microscope, 200, associated with the second embodiment.

Those members of the electron microscope 200 of the second embodiment which are similar in function to their respective counterparts of the electron microscope 100 associated with the first embodiment are hereinafter indicated by the same reference numerals as in the above cited figures and a detailed description thereof is omitted.

The electron microscope 100 has the single aperture stop 30 for aberration measurement as shown in FIG. 1, and the detector 20 has the two detector segments (i.e., the first detector segment 22 and the second detector segment 24).

On the other hand, the electron microscope 200 has a first aperture stop 230a for aberration measurement and a second aperture stop 230b for aberration measurement as shown in FIG. 16. Note that the first aperture stop 230a is one example of a first aperture stop and that the second aperture stop 230b is one example of a second aperture stop. The detector 220 has a single detector segment 222.

Figure 17:
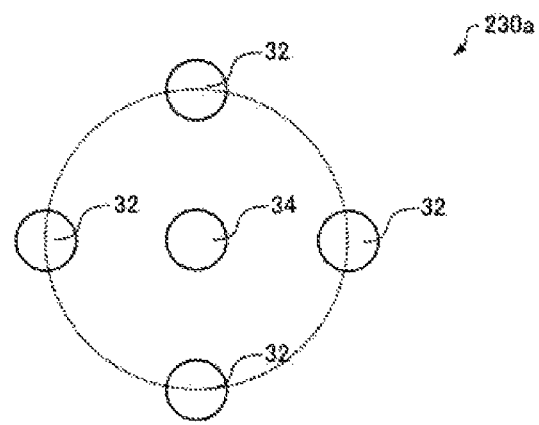
FIG. 17 is a schematic view of a first aberration measurement aperture element as viewed from a direction along the optical axis.
Figure 18:
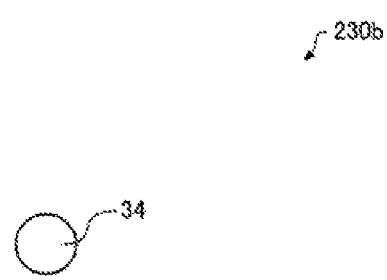
FIG. 18 is a schematic view of a second aberration measurement aperture element as viewed from a direction along the optical axis.

FIG. 17 is a schematic representation of the first aperture stop 230a for aberration measurement, as viewed from a direction along the optical axis Z. FIG. 18 is a schematic representation of the second aperture stop 230b for aberration measurement, as viewed from the direction along the optical axis Z.

The first aperture stop 230a for aberration measurement has a plurality of detection angle-limiting holes 32 and one reference hole 34 similarly to the aperture stop 30 of FIG. 2 for aberration measurement. The second aperture stop 230b for aberration measurement has one reference hole 34.

The first aperture stop 230a and second aperture stop 230b for aberration measurement are arranged in two stages along the optical axis Z.

Figure 19:
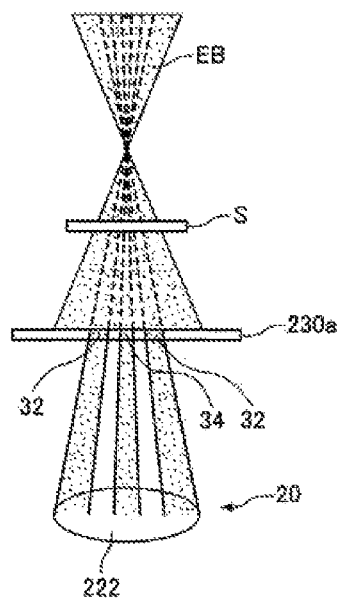
FIG. 19 is a schematic electron ray diagram illustrating the manner in which a first bright-field STEM image is obtained using the first aberration measurement aperture element.

FIG. 19 is a schematic representation illustrating the manner in which a first bright-field STEM image is being obtained by the use of the first aperture stop 230a for aberration measurement. As shown in FIG. 19, placement of the first aperture stop 230a on the optical axis Z permits acquisition of the first bright-field STEM image. At this time, the second aperture stop 230b for aberration measurement is not placed on the optical axis Z.

Figure 20:
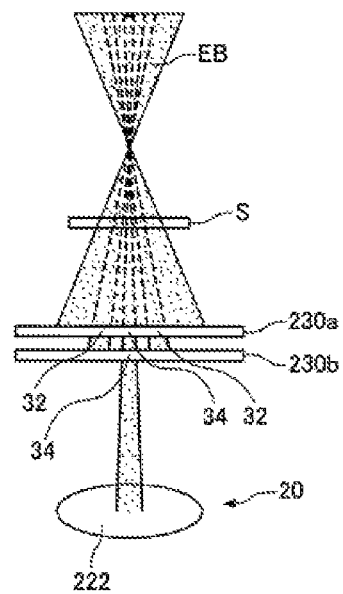
FIG. 20 is a schematic representation illustrating the manner in which a second bright-field STEM image is obtained using both first and second aberration measurement aperture elements.

FIG. 20 is a schematic representation illustrating the manner in which the second bright-field STEM image is being obtained through the use of the first aperture stop 230a and second aperture stop 230b for aberration measurement. When these first aperture stop 230a and second aperture stop 230b are placed on the optical axis Z as shown in FIG. 20, the rays of the electron beam EB passed through the detection angle-limiting holes 32 in the first aperture stop 230a are blocked by the second aperture stop 230b. On the other hand, the rays of the electron beam EB passed through the reference hole 34 in the first aperture stop 230a pass through the second aperture stop 230b and are detected by the detector segment 222 of the detector 20. Consequently, the second bright-field STEM image can be obtained.

The first aperture stop 230a and second aperture stop 230b for aberration measurement may be formed in one aperture plate in a manner not illustrated. That is, the first aperture stop 230a and second aperture stop 230b are switchably used. In this case, when the first bright-field STEM image is obtained, only the first aperture stop 230a is placed on the optical axis Z. When the second bright-field STEM image is obtained, only the second aperture stop 230b is placed on the optical axis Z.

Figure 21:
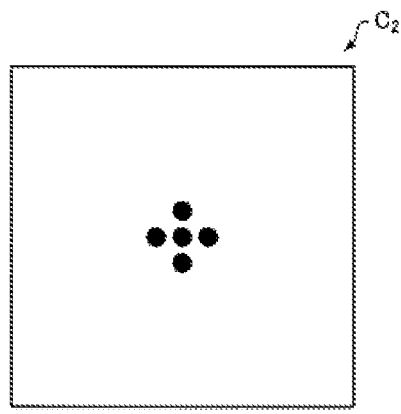
FIG. 21 is a schematic representation showing an image indicative of the result of a computation of a correlation function between the first and second STEM images.

FIG. 21 is a schematic representation showing an image $C_2$ indicative of the result of a calculation of a correlation function between the first bright-field STEM image $I_{22}$ and the second bright-field STEM image $I_{24}$.

In the present embodiment, five peaks appear in the image $C_2$. An aberration can be calculated from the image $C_2$ in the same way as in the above-described first embodiment.

The method of aberration measurement associated with the second embodiment is similar to the method of aberration measurement associated with the first embodiment except that the first aperture stop 230a and second aperture stop 230b for aberration measurement are used and so a description thereof is omitted.

The electron microscope 200 has the following features. The electron microscope 200 can simultaneously obtain plural images formed from rays of the electron beam EB having mutually different detection angles in the same way as in the above-described electron microscope 100. Therefore, the effects of image drifts can be reduced. The aberration can be measured with high accuracy.

Furthermore, the electron microscope 200 has the first aperture stop 230a and second aperture stop 230b for aberration measurement, and the first aperture stop 230a has the plurality of detection angle-limiting holes 32. The second aperture stop 230b for aberration measurement has the reference hole 34. Therefore, the electron microscope 200 can obtain the first and second bright-field STEM images by the single detector segment 222.

In addition, in the electron microscope 200, the second aperture stop 230b for aberration measurement has the reference hole 34 and so the first aperture stop 230a and second aperture stop 230b for aberration measurement can be arranged as two stages and the second bright-field STEM image can be obtained. In consequence, the aberration can be measured with high accuracy.

For example, where the first bright-field STEM image is obtained using the first aperture stop 230a for aberration measurement and then the first aperture stop 230a is replaced by the second aperture stop 230b and the second bright-field STEM image is obtained, the position of the reference hole 34 may deviate. The electron microscope 200 is free of this problem and, therefore, the aberration can be measured with high accuracy.

3. Third Embodiment

Figure 22:
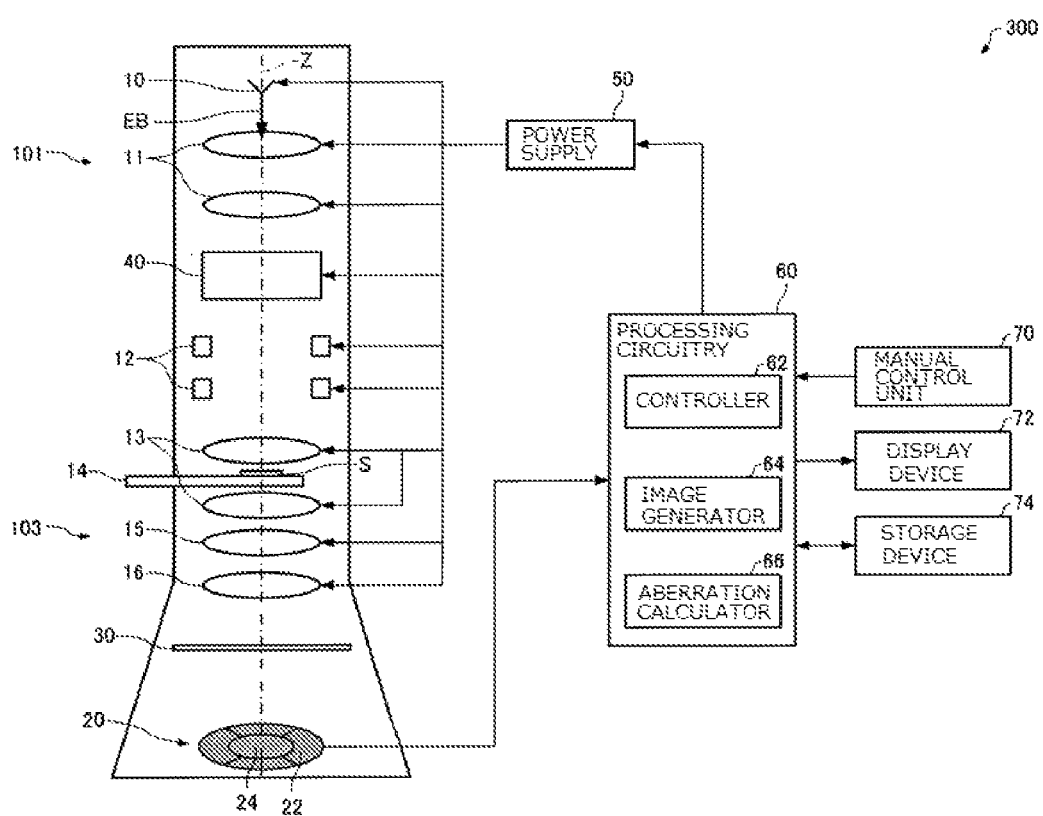
FIG. 22 is a schematic representation, partly in block form, of an electron microscope associated with a third embodiment.

An electron microscope associated with a third embodiment is next described by referring to FIG. 22, which schematically shows the electron microscope, 300, associated with the third embodiment.

Those members of the electron microscope 300 associated with the third embodiment which are similar in function to their respective counterparts of the electron microscope 100 associated with the first embodiment are hereinafter indicated by the same reference numerals as in the above referenced figures and a detailed description thereof is omitted.

As shown in FIG. 22, the electron microscope 300 is different from the electron microscope 100 in that the first detector segment 22 of the detector 20 is divided into a plurality of subsegments which can independently detect rays of the electron beam EB.

Figure 23:
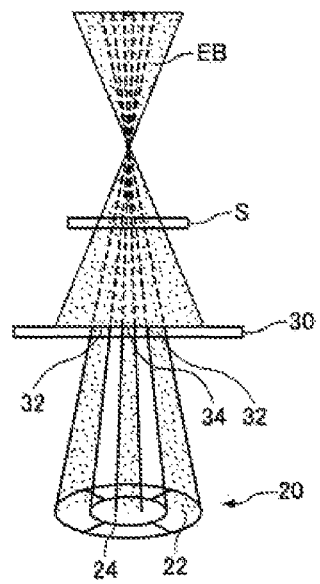
FIG. 23 is a schematic electron ray diagram illustrating the manner in which electron beam rays impinge on the detector.
Figure 24:
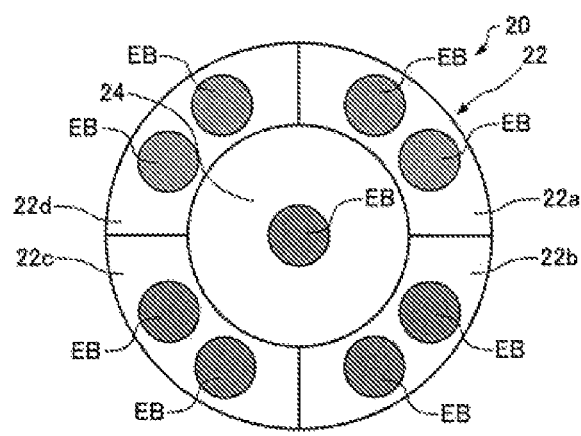
FIG. 24 is a schematic view illustrating the manner in which electron beam rays impinge on the detector.
Figure 25:
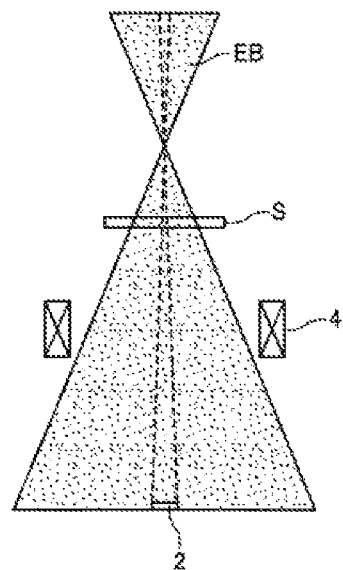
FIGS. 25 and 26 are diagrams illustrating one example of method of aberration measurement for use in a scanning transmission electron microscope.
Figure 26:
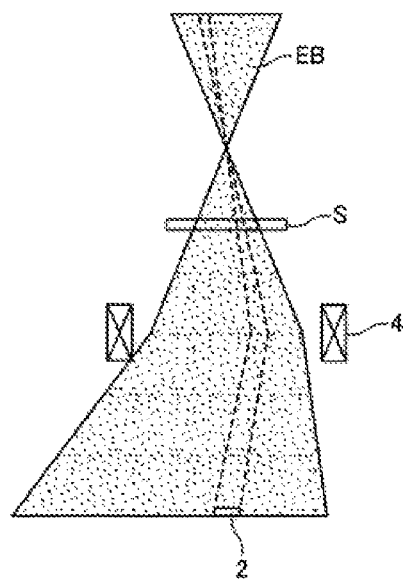
Figure 27:
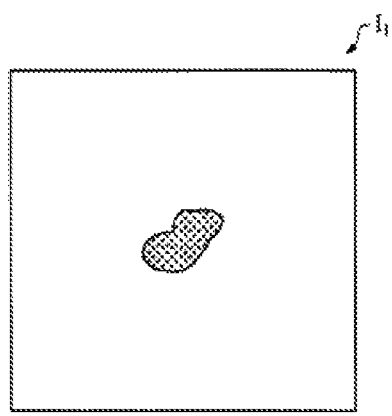
FIG. 27 is a schematic representation showing a bright-field STEM image obtained under conditions where the electron beam is not deflected by the deflector.
Figure 28:
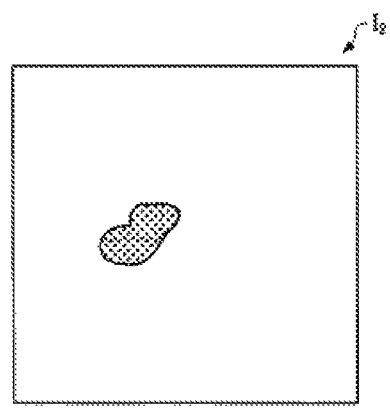
FIG. 28 is a schematic representation showing a bright-field STEM image obtained under conditions where the electron beam is deflected by the deflector.

FIGS. 23 and 24 schematically illustrate the manner in which the electron beam EB impinges on the detector 20.

The detector 20 is a segmented detector whose detection surface is split into a plurality of segments. In the illustrated example, the detector 20 has a first detector segment 22 and a second detector segment 24. The first detector segment 22 is divided into a first subsegment 22a, a second subsegment 22b, a third subsegment 22c, and a fourth subsegment 22d. The first through fourth subsegments 22a-22d can independently detect rays of the electron beam EB. No restriction is imposed on the number of division of the first detector segment 22.

Because the first detector segment 22 is split into the plural subsegments 22a-22d, a plurality of first bright-field STEM images can be obtained at the same time. Therefore, a correlation function between each of the first bright-field STEM images and the second bright-field STEM image can be calculated. This can reduce the number of peaks appearing in each one correlation function.

The method of aberration measurement associated with the third embodiment is similar to the method of aberration measurement associated with the first embodiment except that the first detector segment 22 is divided into the subsegments 22a-22d which can independently detect rays of the electron beam EB and so a description thereof is omitted.

The electron microscope 300 has the following features. The electron microscope 300 can simultaneously obtain plural images using mutually different detection angles in the same way as in the above-described electron microscope 100. Therefore, the effects of image drifts can be reduced, and aberrations can be measured with high accuracy.

Furthermore, in the electron microscope 300, the first detector segment 22 is split into the plural subsegments 22a-22d and so in the electron microscope 300, the number of first bright-field STEM images capable of being derived at the same time can be increased, and the number of peaks appearing in each one correlation function can be reduced. This facilitates separating the peaks appearing in the correlation function. Hence, aberrations can be computed easily.

Additionally, in the electron microscope 300, the rays of the electron beam EB impinging on the segments and subsegments of the detector 20 can be limited using the aperture stop 30 for aberration measurement and, therefore, the rays of the electron beam EB can be made to hit the detector 20 at detection angles optimal for aberration measurement irrespective of the shape or arrangement of the segments and subsegments of the detector 20.

It is to be noted that the above embodiments and modifications are merely exemplary and that the invention is not restricted thereto. For example, the embodiments and modifications may be combined appropriately.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described my invention with the detail and particularity required by the Patent Laws, what is desired protected by Letters Patent is set forth in the following claims.

The invention claimed is:

1. An electron microscope comprising:
an electron beam source for producing an electron beam;
an illumination lens system for focusing the electron beam onto a sample;
a scanner for scanning the focused electron beam over the sample;
an aperture stop having a plurality of detection angle-limiting holes for extracting rays of the electron beam having mutually different detection angles from the electron beam transmitted through the sample and one reference hole for extracting rays of the electron beam passed through the reference hole having a reference detection angle;
a detector for detecting the rays of the electron beams passed through the aperture stop, said detector having a first detector segment and a second detector segment, said first detector segment being operative to detect rays of the electron beam passed through said plurality of detection angle-limiting holes, and said second detector segment being operative to detect rays of the electron beam passed through the reference hole,
an image generator for generating a first STEM (scanning transmission electron microscope) image based on the output from said first detector segment and a second STEM image based on the output from the second detector segment; and
an aberration calculator for finding an aberration in said illumination lens system based on the first STEM image and the second STEM image.

2. The electron microscope as set forth in claim 1, wherein said aberration calculator finds the aberration in said illumination lens system by calculating a correlation function between said first STEM image and said second STEM image.

3. The electron microscope as set forth in claim 1,
wherein said first detector segment has an annular shape and said second detector segment being positioned in an area surrounded by the first detector segment.

4. The electron microscope as set forth in claim 3, wherein said first detector segment is split into a plurality of subsegments capable of independently detecting rays of the electron beam.

5. A method of measuring an aberration in an illumination lens system of an electron microscope having an electron beam source for producing an electron beam, said illumination lens system for focusing the electron beam onto a sample, a scanner for scanning the focused electron beam over the sample, and a detector for detecting the electron beam transmitted through the sample; said method comprising the steps of:
(a) placing a first aperture stop having a plurality of detection angle-limiting holes for extracting rays of the electron beam having mutually different detection angles from the electron beam transmitted through the sample at a position between the sample and the detector, detecting the rays of the electron beams and obtaining a first STEM (scanning transmission electron microscope) image;
(b) placing a second aperture stop having a reference detection angle-limiting hole for extracting rays of the electron beam having a reference detection angle from the electron beam transmitted through the sample at a position between the sample and the detector, detecting the rays of the electron beam and obtaining a second STEM image; and
(c) calculating the aberration in said illumination lens system based on the first STEM image and the second STEM image.

6. The method of measuring an aberration in an illumination lens system of an electron microscope as set forth in claim 5, wherein said steps of (a) and (b) are executed by using the single aperture stop having both a plurality of detection angle-limiting holes and a reference detection angle-limiting hole.

7. The method of measuring an aberration in an illumination lens system of an electron microscope as set forth in claim 5,
wherein the aberration is found based on calculation of a correlation function between said first STEM image and said second STEM image in step (c).

8. An electron microscope comprising:
an electron beam source for producing an electron beam;
an illumination lens system for focusing the electron beam onto a sample;
a scanner for scanning the focused electron beam over the sample;
a first aperture stop having a plurality of detection angle-limiting holes for extracting rays of the electron beam having mutually different detection angles from the electron beam transmitted through the sample;
a second aperture stop having a reference detection angle-limiting hole for extracting rays of the electron beam having specific detection angle from the electron beam transmitted through the sample, wherein the first and second aperture stops may be arranged in two stages along the path of the electron beam transmitted through the sample or selectively placed in a path of the electron beam transmitted through the sample;
a detector for detecting the rays of the electron beams passed through the aperture stops;
an image generator for generating a first STEM (scanning transmission electron microscope) image based on results of detections performed by said detector by detecting the rays of the electron beams passed through the first aperture stop and for generating a second STEM image based on results of detections performed by said detector by detecting the rays of the electron beam passed through the second aperture stop; and
an aberration calculator for finding an aberration in said illumination lens system based on the first STEM image and the second STEM image.

9. The electron microscope as set forth in claim 8, wherein said aberration calculator finds the aberration in said illumination lens system by calculating a correlation function between said first STEM image and said second STEM image.

* * * * *